United States Patent
Mustafa et al.

(10) Patent No.: US 11,415,147 B2
(45) Date of Patent: Aug. 16, 2022

(54) PUMPING LINER FOR IMPROVED FLOW UNIFORMITY

(71) Applicant: Applied Materials, Inc., Santa Clara, CA (US)

(72) Inventors: Muhannad Mustafa, Milpitas, CA (US); Muhammad M. Rasheed, San Jose, CA (US); Mario D. Sanchez, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 84 days.

(21) Appl. No.: 16/886,088

(22) Filed: May 28, 2020

(65) Prior Publication Data

US 2020/0378402 A1 Dec. 3, 2020

Related U.S. Application Data

(60) Provisional application No. 62/853,700, filed on May 28, 2019.

(51) Int. Cl.
*C23C 16/40* (2006.01)
*F04D 29/42* (2006.01)
*F04D 29/62* (2006.01)
*C23C 16/44* (2006.01)

(52) U.S. Cl.
CPC ...... *F04D 29/4286* (2013.01); *C23C 16/4412* (2013.01); *F04D 29/62* (2013.01)

(58) Field of Classification Search
CPC . F04D 29/4286; F04D 29/62; C23C 16/4412; C23C 16/4584

USPC ................. 118/715; 156/345.33, 345.34
See application file for complete search history.

(56) References Cited

U.S. PATENT DOCUMENTS

| | | | |
|---|---|---|---|
| 4,431,602 A | 2/1984 | Behrens et al. | |
| 5,605,637 A * | 2/1997 | Shan ................ | H01J 37/32477 118/723 E |
| 5,891,350 A * | 4/1999 | Shan ................ | H01J 37/32834 216/71 |
| 6,261,408 B1 * | 7/2001 | Schneider ........... | C23C 16/4412 118/715 |
| 6,264,788 B1 * | 7/2001 | Tomoyasu ........ | H01J 37/32935 156/345.43 |
| 6,511,577 B1 * | 1/2003 | Johnson ............ | H01J 37/32724 156/345.48 |
| 6,531,069 B1 * | 3/2003 | Srivastava .......... | H01J 37/3244 118/723 R |
| 6,733,620 B1 * | 5/2004 | Sugiyama ......... | H01J 37/32633 156/345.29 |
| 6,963,043 B2 * | 11/2005 | Fink ................. | H01J 37/32642 118/723 R |

(Continued)

*Primary Examiner* — Rudy Zervigon
(74) *Attorney, Agent, or Firm* — Servilla Whitney LLC

(57) ABSTRACT

Pumping liners for process chambers including a first ring-shaped body and a second ring-shaped body are described. The first ring-shaped body has a first plurality of openings and the second ring-shaped body has a second plurality of openings. The first ring-shaped body and the second ring-shaped body are rotatable relative to each other around a central axis to at least partially overlap the first plurality of openings and the second plurality of openings to change the area of conductance through the openings. Methods of removing gases from a processing chamber are also described.

17 Claims, 9 Drawing Sheets

(56) References Cited

U.S. PATENT DOCUMENTS

| | | | | |
|---|---|---|---|---|
| 7,109,660 B2* | 9/2006 | Ishihara | ............ | H01J 37/32633 315/111.11 |
| 7,416,677 B2* | 8/2008 | Takahashi | ......... | H01J 37/32844 216/71 |
| 8,075,728 B2* | 12/2011 | Balakrishna | ........ | H01J 37/3244 156/345.26 |
| 8,152,925 B2* | 4/2012 | Iizuka | ................. | H01J 37/3244 118/715 |
| 8,597,462 B2* | 12/2013 | Brown | ............. | H01J 37/32495 156/345.37 |
| 8,747,610 B2* | 6/2014 | Chen | ................. | H01J 37/32504 156/345.39 |
| 8,771,417 B2* | 7/2014 | Yoon | ................... | H01J 37/3244 118/715 |
| 8,790,489 B2* | 7/2014 | Honda | ................ | H01L 21/6719 156/345.29 |
| 9,269,564 B2* | 2/2016 | Han | .................... | C23C 16/4412 |
| 9,779,918 B2* | 10/2017 | Lee | ..................... | C23C 16/4412 |
| 10,287,687 B2* | 5/2019 | Je | ........................... | C23C 16/52 |
| 2002/0038791 A1* | 4/2002 | Okumura | ............ | H01J 37/3244 216/71 |
| 2004/0129218 A1* | 7/2004 | Takahashi | ......... | H01J 37/32834 118/715 |
| 2005/0167052 A1* | 8/2005 | Ishihara | ............ | H01J 37/32834 156/345.47 |
| 2005/0224179 A1* | 10/2005 | Moon | ............... | H01J 37/32834 156/345.29 |
| 2007/0266945 A1* | 11/2007 | Shuto | ................ | H01J 37/32091 118/723 E |
| 2008/0035605 A1* | 2/2008 | Takahashi | ......... | H01J 37/32844 216/58 |
| 2008/0149596 A1* | 6/2008 | Dhindsa | ............ | H01J 37/32642 216/67 |
| 2009/0218043 A1* | 9/2009 | Balakrishna | ........ | H01J 37/3244 156/345.33 |
| 2010/0206231 A1* | 8/2010 | Yoon | ................. | H01J 37/32834 118/723 I |
| 2012/0000886 A1* | 1/2012 | Honda | .............. | H01J 37/32633 216/24 |
| 2014/0139727 A1 | 5/2014 | Mao et al. | | |
| 2015/0187545 A1* | 7/2015 | Lee | ................... | H01J 37/32834 216/67 |
| 2018/0190475 A1 | 7/2018 | Shin | | |

* cited by examiner

PUMPING LINER FOR IMPROVED FLOW UNIFORMITY

CROSS-REFERENCE TO RELATED APPLICATIONS

This application claims priority to U.S. Provisional Application No. 62/853,700, filed May 28, 2019, the entire disclosure of which is hereby incorporated by reference herein.

TECHNICAL FIELD

Embodiments of the present disclosure pertain to the field of electronic device manufacturing. More particularly, embodiments of the disclosure are directed to apparatus to improve flow control in processing chambers.

BACKGROUND

Various processing chambers, for example, Atomic Layer Deposition (ALD) and Chemical Vapor Deposition (CVD) chambers use uniform pumping capability to distribute precursors uniformly across a wafer. Typically, film deposition uniformity on a wafer is affected due to the non-uniform pumping, specifically at fore line pumping port locations.

Therefore, there is an ongoing need in the art for apparatus and methods for providing a uniform flow of gases in the process volume of a processing chamber.

SUMMARY

One or more embodiments of the disclosure are directed to pump liners for process chambers. The pump liners comprise a first a first ring-shaped body and a second ring-shaped body. The first ring-shaped body has an inner peripheral edge, an outer peripheral edge, a top surface, a bottom surface, and a first plurality of openings extending through the first ring-shaped body from the top surface to the bottom surface. The second ring-shaped body has an inner peripheral edge, an outer peripheral edge, a top surface, a bottom surface, and a second plurality of openings extending through the second ring-shaped body from the top surface to the bottom surface. The top surface of one of the first ring-shaped body or the second ring-shaped body is adjacent the bottom surface of the other of the first ring-shaped body or the second ring-shaped body so that the first plurality of openings are alignable with the second plurality of openings. The first ring-shaped body and the second ring-shaped body are rotatable relative to each other around a central axis.

Additional embodiments of the disclosure are directed to processing chamber or processing stations comprising a gas distribution assembly, a substrate support with a support surface facing the gas distribution assembly, and the pump liner as described herein.

Further embodiments of the disclosure are directed to pump liners for process chambers. The pump liners comprise a first ring-shaped body and a second ring-shaped body. The first ring-shaped body has an inner peripheral edge, an outer peripheral edge, a top surface and a bottom surface. One of the top surface or bottom surface comprises an annular groove. A first plurality of openings is within the annular groove and extend through the first ring-shaped body from the top surface to the bottom surface. The second ring-shaped body is sized to fit within the annular groove of the first ring-shaped body. The second ring-shaped body has an inner peripheral edge, an outer peripheral edge, a top surface and a bottom surface. A second plurality of openings extends through the second ring-shaped body from the top surface to the bottom surface. The second plurality of openings is aligned with the first plurality of openings. A slot-shaped alignment opening extends along a portion of the ring-shaped body adjacent one of the outer peripheral edge and the inner peripheral edge of the second ring-shaped body. The slot-shaped alignment opening extends through the second ring-shaped body from the top surface to the bottom surface. An adjustment fastener is configured to fix the second ring-shaped body in position relative to the first ring-shaped body. At least one calibration mark is on one or more of the first body and the second body. The at least one calibration mark is indicative of a degree of overlap of the first plurality of openings and the second plurality of openings. The first ring-shaped body and second ring-shaped body are rotatable relative to each other around a central axis.

Further embodiments of the disclosure are directed to methods for removing gases from a processing chamber. A first plurality of openings in a first ring-shaped body is aligned with a second plurality of openings in a second ring-shaped body to at least partially overlap the first plurality of openings with the second plurality of openings. Reduced pressure is applied to one side of the first ring-shaped body to draw gases through the at least partially overlapping first plurality of openings and second plurality of openings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

The Figures show pump liners according to one or more embodiments of the disclosure.

Figure 1:
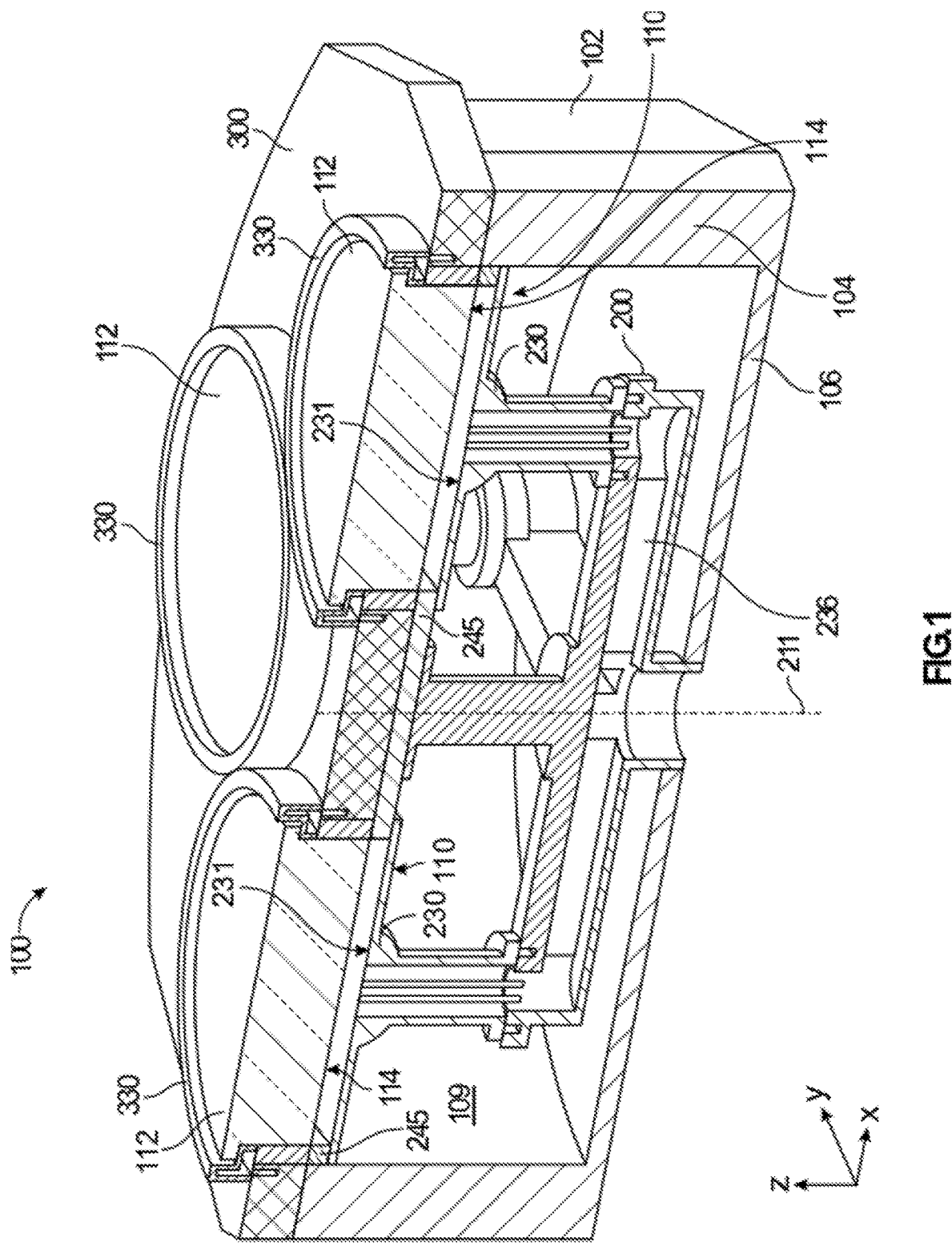
FIG. 1 shows a cross-sectional isometric view of a processing chamber in accordance with one or more embodiment of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

One or more embodiments of the disclosure advantageously provide adjustability for uniform pumping efficiency through pumping liner holes. Some embodiments of the disclosure advantageously provide an apparatus to optimize in-situ pumping liner hole sizes to adjust pressure uniformity. Some embodiments of the disclosure advantageously provide pumping lines that improve film deposition non-uniformity.

Flow simulation schemes can be helpful to determine hole size optimization parameters. However, change of process recipes are so frequent that an in-situ pumping liner hole optimization apparatus can be advantageously used to improve pumping uniformity. Re-machining pumping liners are somewhat expensive. Accordingly, one or more embodiments of the disclosure advantageously provide a technique to optimize in-situ pumping liner hole size.

Fringe patterning ring (FP ring) is designed in such a way it can be attached to pumping liner to alter the flow conductance. Flow conductance depends on total opening area through the ring holes. The area of conductance can be changed simply by overlapping the fringe patterning ring with pumping liner holes. The technique is analogous to optical fringe patterning. The open area can be decreased when flow choking is needed to eliminate pressure skewness towards pumping port locations by rotating FP ring with respect to liner. It is noted that for high pressure process like a-Si, choked flow is needed to eliminate the jet effects at pumping port locations as well as to maintain relatively high pressure (300 Torr) process environment.

Some embodiments of the disclosure advantageously allow for adjusting pumping liner opening area by rotating a second ring (also referred to as a fringe patterning (FP) ring) to change flow conductance as needed. Some embodiments advantageously allow changing the flow conductance without re-machining the pumping liner holes.

The disclosure provides fringe patterning rings for pump liners used with gas distribution assemblies in single wafer or multi-wafer (also referred to a batch) process chambers. The description of the pump liner below is discussed in respect to a batch process chamber. However, the skilled artisan will recognize that the pump liner is not limited to batch process chambers or process stations within batch process chambers. In some embodiments, the pump liner is incorporated into a single wafer processing chamber.

Figure 2:
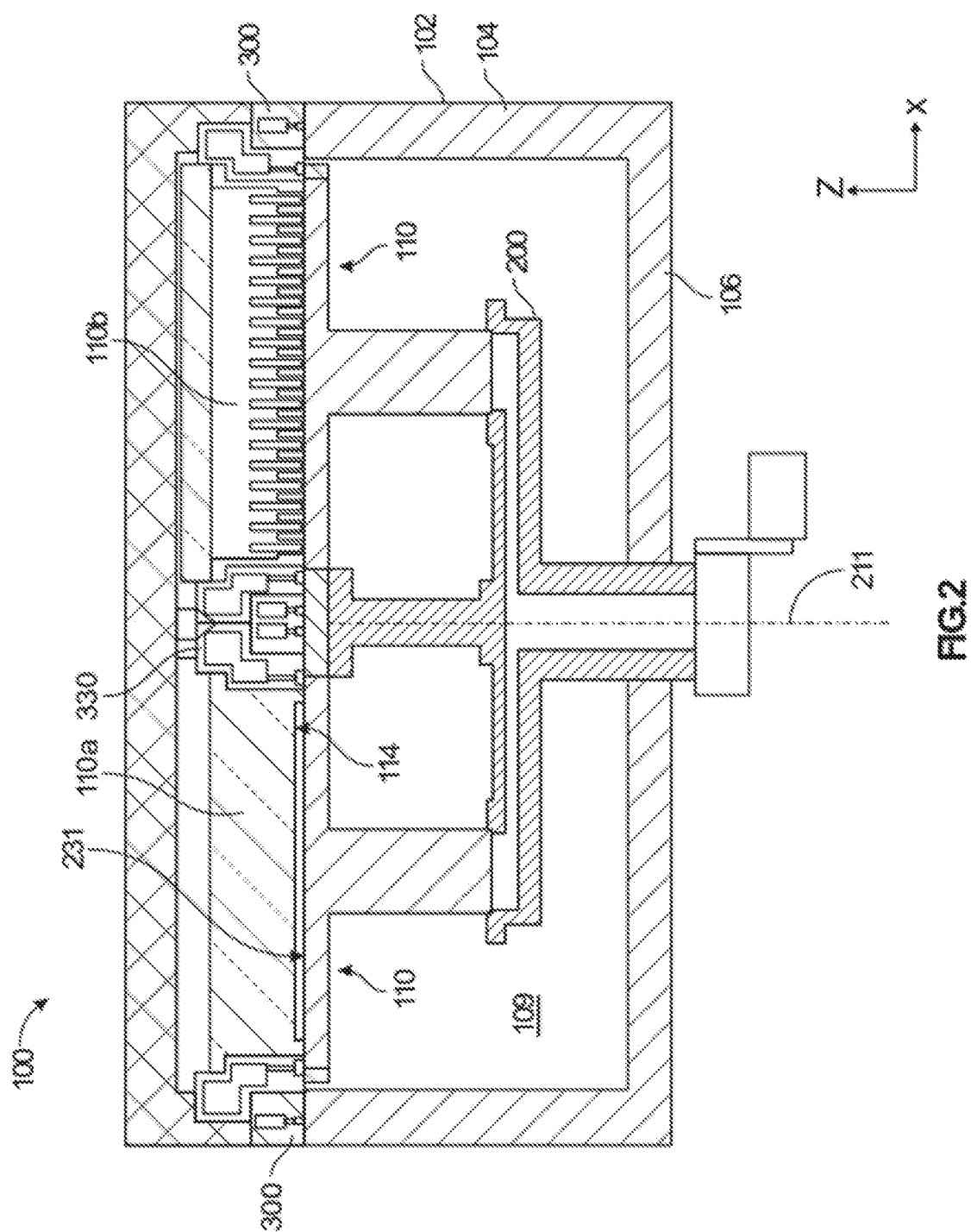
FIG. 2 shows a cross-sectional view of a processing chamber in accordance with one or more embodiment of the disclosure.

FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200 and top plate 300.

The processing chamber 100 has a housing 102 with walls 104 and a bottom 106. The housing 102 along with the top plate 300 define a processing volume 109, also referred to as an interior volume.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas injectors 112 are substantially coplanar. The processing stations 110 are defined as a region in which processing can occur. For example, in some embodiments, a processing station 110 is defined as a region bounded by the support surface 231 of the heaters 230, as described below, and the front surface 114 of the gas injectors 112. In the illustrated embodiment, the heaters 230 act as substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
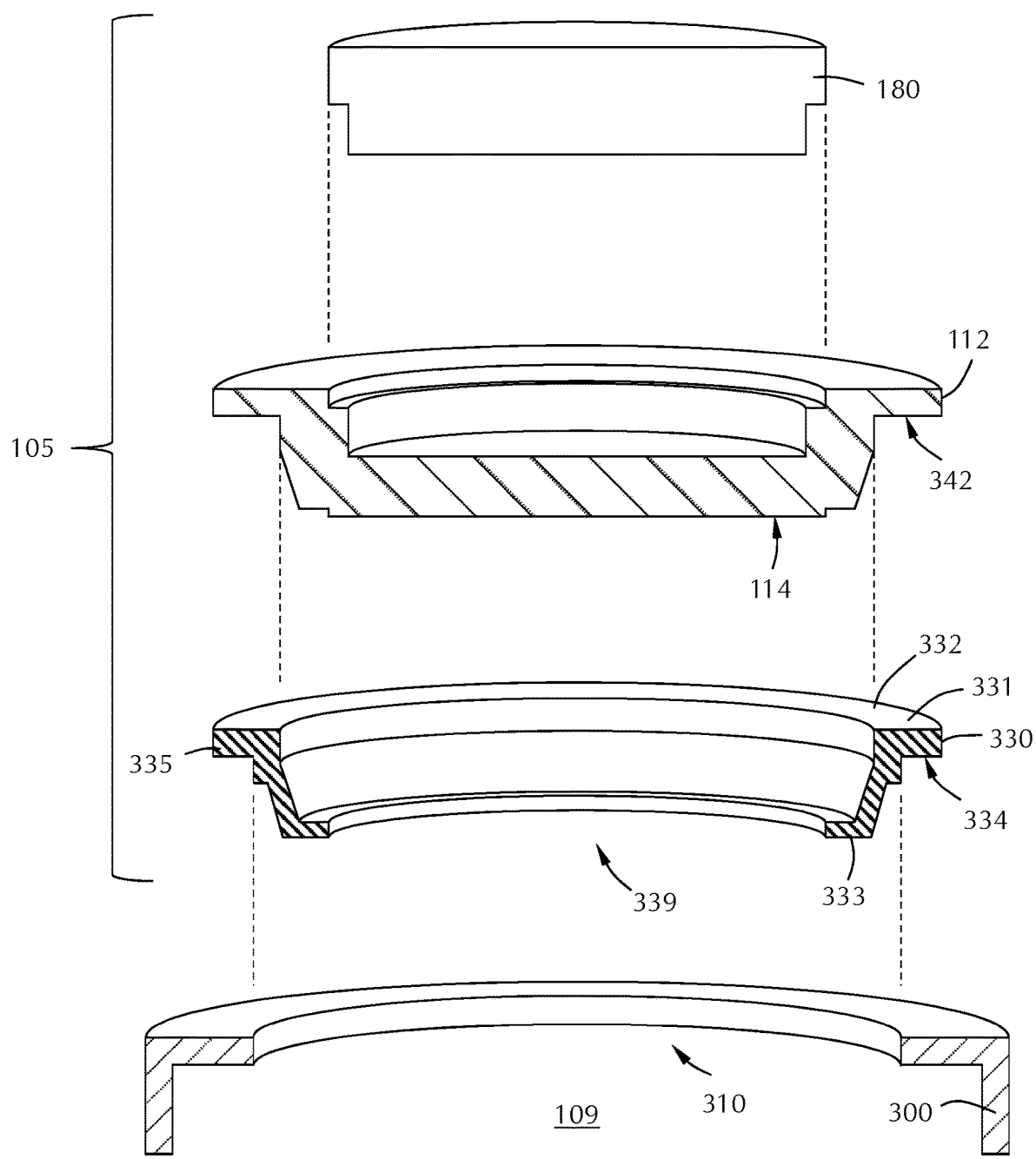
FIG. 3 is an exploded cross-sectional view of a processing station in accordance with one or more embodiment of the disclosure.

FIG. 3 illustrates an exploded view of a gas distribution assembly 105 for use in a processing station 110 or a process chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and a pump liner 330. The pump liner 330 is also referred to as a pump/purge spacer, insert or pump/purge insert. In some embodiments, the pump liner 330 is connected to or in fluid communication with a vacuum (exhaust). In some embodiments, the pump liner 330 is connected to or in fluid communication with a purge gas source.

The openings 310 in the top plate 300 of the processing chamber can be uniformly sized or have different sizes. Different sized/shape gas injectors 112 can be used with a pump liner 330 that is suitably shaped to transition from the opening 310 to the gas distribution plate 112. For example, as illustrated, the pump liner 330 includes a top surface 331 and bottom surface 333 with a sidewall 335. When inserted into the opening 310 in the top plate 300, a support surface 334 is configured to be positioned in the opening 310.

The pump liner 330 includes an opening 339 in which a gas distribution plate 112 can be inserted. The gas distribution plate 112 illustrated has a flange 342 which can be in contact with the ledge formed by the back surface 332 adjacent the top surface 331 of the pump liner 330. The diameter or width of the gas distribution plate 112 can be any suitable size that can fit within the opening 339 of the pump liner 330. This allows gas injectors 112 of various types to be used within the same opening 310 in the top plate 300.

Figure 4:
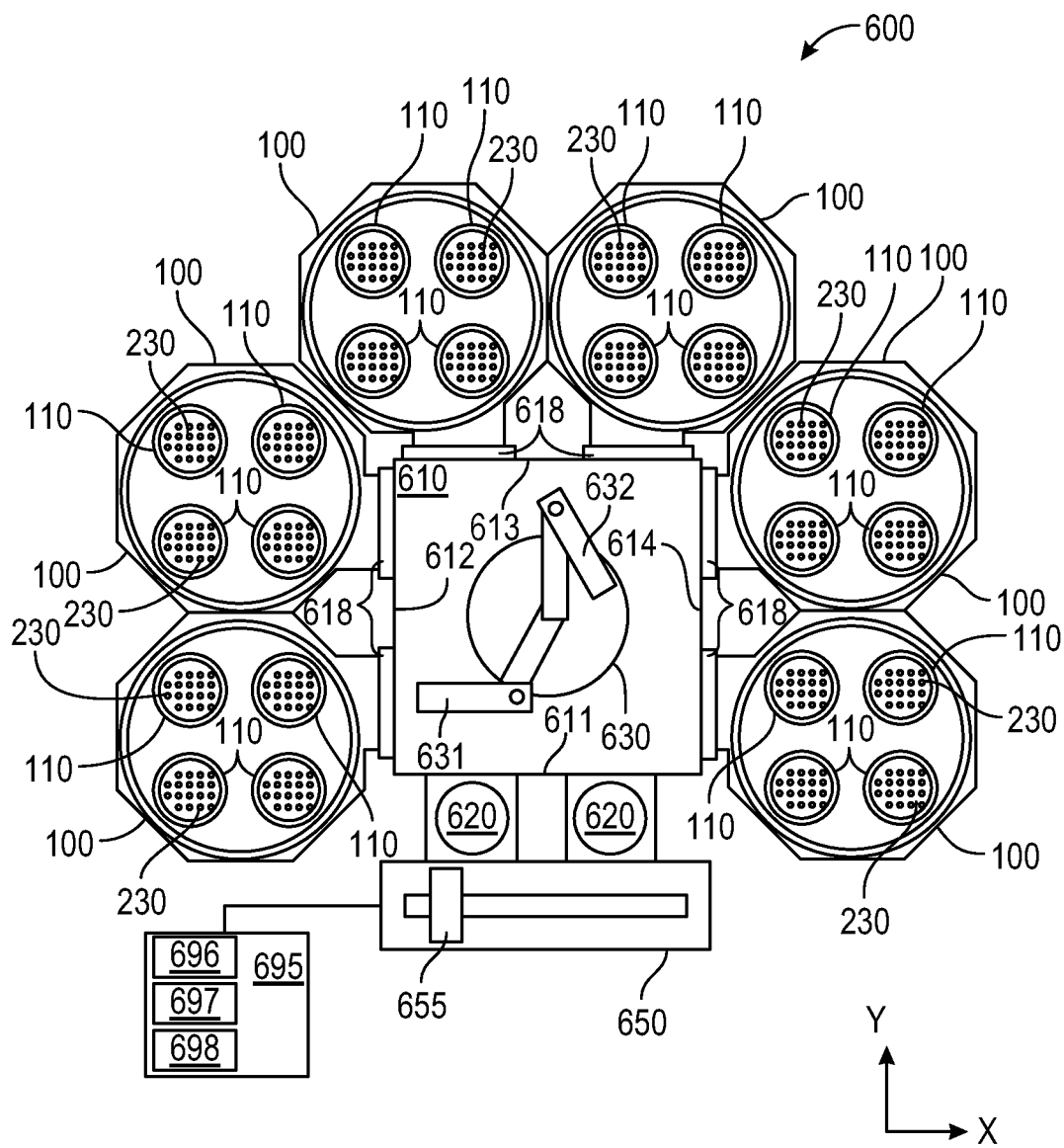
FIG. 4 is a schematic representation of a processing platform in accordance with one or more embodiment of the disclosure.

FIG. 4 shows a processing platform 600 in accordance with one or more embodiment of the disclosure. The embodiment shown in FIG. 4 is merely representative of one possible configuration and should not be taken as limiting the scope of the disclosure. For example, in some embodiments, the processing platform 600 has a different numbers of one or more of the processing chambers 100, buffer stations 620 and/or robot 630 configurations than the illustrated embodiment.

The exemplary processing platform 600 includes a central transfer station 610 which has a plurality of sides 611, 612, 613, 614. The transfer station 610 shown has a first side 611, a second side 612, a third side 613 and a fourth side 614. Although four sides are shown, those skilled in the art will understand that there can be any suitable number of sides to the transfer station 610 depending on, for example, the overall configuration of the processing platform 600. In some embodiments, there the transfer station 610 has three sides, four sides, five sides, six sides, seven sides or eight sides.

The transfer station 610 has a robot 630 positioned therein. The robot 630 can be any suitable robot capable of moving a wafer during processing. In some embodiments, the robot 630 has a first arm 631 and a second arm 632. The first arm 631 and second arm 632 can be moved independently of the other arm. The first arm 631 and second arm 632 can move in the x-y plane and/or along the z-axis. In some embodiments, the robot 630 includes a third arm (not shown) or a fourth arm (not shown). Each of the arms can move independently of other arms.

The embodiment illustrated includes six processing chambers 100 with two connected to each of the second side 612, third side 613 and fourth side 614 of the central transfer station 610. Each of the processing chambers 100 can be configured to perform different processes.

The processing platform 600 can also include one or more buffer station 620 connected to the first side 611 of the central transfer station 610. The buffer stations 620 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 600 may also include one or more slit valves 618 between the central transfer station 610 and any of the processing chambers 100. The slit valves 618 can open and close to isolate the interior volume within the processing chamber 100 from the environment within the central transfer station 610. For example, if the processing chamber will generate plasma during processing, it may be helpful to close the slit valve for that processing chamber to prevent stray plasma from damaging the robot in the transfer station.

The processing platform 600 can be connected to a factory interface 650 to allow wafers or cassettes of wafers to be loaded into the processing platform 600. A robot 655 within the factory interface 650 can be used to move the wafers or cassettes into and out of the buffer stations. The wafers or cassettes can be moved within the processing platform 600 by the robot 630 in the central transfer station 610. In some embodiments, the factory interface 650 is a transfer station of another cluster tool (i.e., another multiple chamber processing platform).

A controller 695 may be provided and coupled to various components of the processing platform 600 to control the operation thereof. The controller 695 can be a single controller that controls the entire processing platform 600, or multiple controllers that control individual portions of the processing platform 600. For example, the processing platform 600 of some embodiments comprises separate controllers for one or more of the individual processing chambers 100, central transfer station 610, factory interface 650 and/or robots 630.

In some embodiments, the processing chamber 100 further comprises a controller 695 connected to the plurality of substantially coplanar support surfaces 231 configured to control one or more of the first temperature or the second temperature. In one or more embodiments, the controller 695 controls a movement speed of the substrate support 200 (FIG. 2).

In some embodiments, the controller 695 includes a central processing unit (CPU) 696, a memory 697, and support circuits 698. The controller 695 may control the processing platform 600 directly, or via computers (or controllers) associated with particular process chamber and/or support system components.

The controller 695 may be one of any form of general-purpose computer processor that can be used in an industrial setting for controlling various chambers and sub-processors. The memory 697 or computer readable medium of the controller 695 may be one or more of readily available memory such as random access memory (RAM), read only memory (ROM), floppy disk, hard disk, optical storage media (e.g., compact disc or digital video disc), flash drive, or any other form of digital storage, local or remote. The memory 697 can retain an instruction set that is operable by the processor (CPU 696) to control parameters and components of the processing platform 600.

The support circuits 698 are coupled to the CPU 696 for supporting the processor in a conventional manner. These circuits include cache, power supplies, clock circuits, input/output circuitry and subsystems, and the like. One or more processes may be stored in the memory 698 as software routine that, when executed or invoked by the processor, causes the processor to control the operation of the processing platform 600 or individual processing chambers in the manner described herein. The software routine may also be stored and/or executed by a second CPU (not shown) that is remotely located from the hardware being controlled by the CPU 696.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 695 has one or more configurations to execute individual processes or sub-processes to perform the method. The controller 695 can be connected to and configured to operate intermediate components to perform the functions of the methods. For example, the controller 695 can be connected to and configured to control one or more of gas valves, actuators, motors, slit valves, vacuum control or other components.

Figure 5:
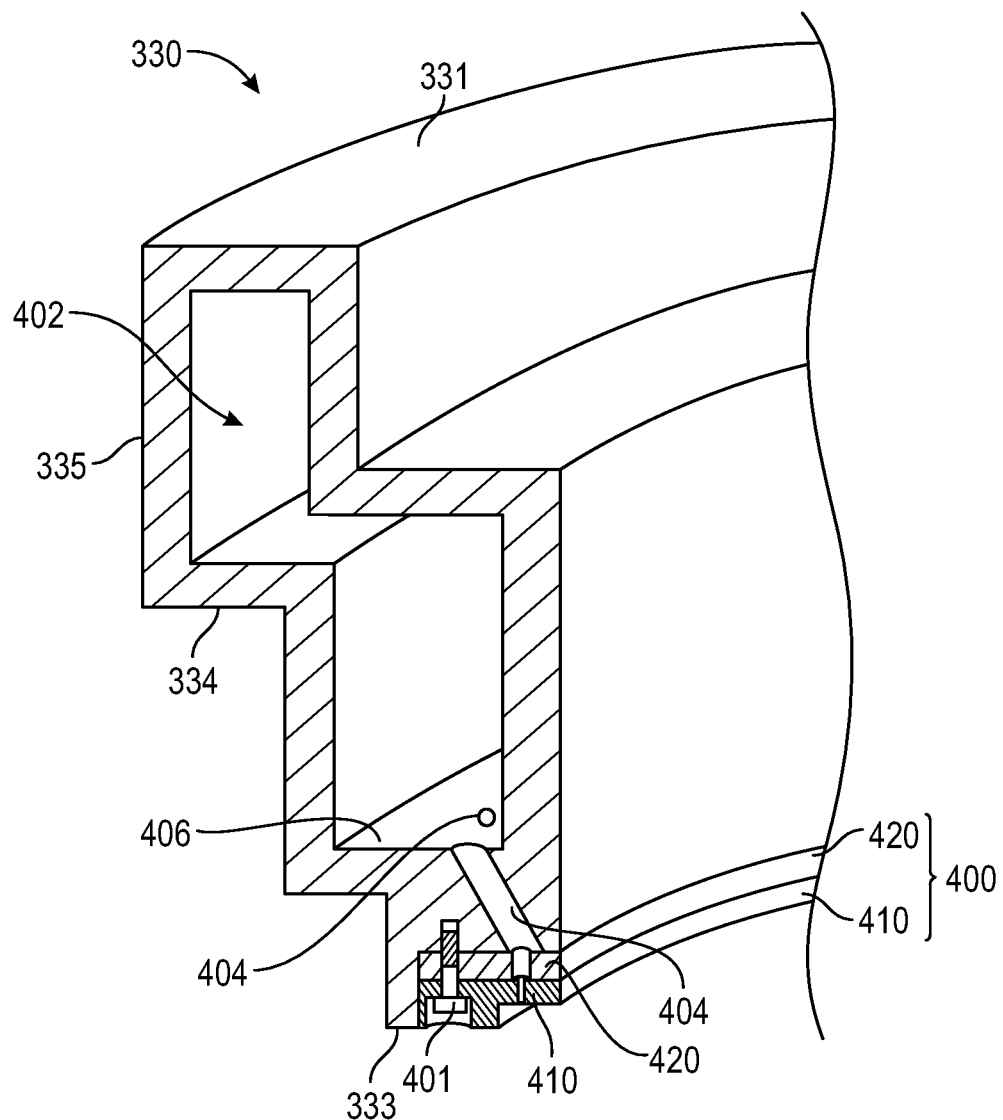
FIG. 5 is a partial cross-sectional view of a purge ring in accordance with one or more embodiment of the disclosure.

FIG. 5 illustrates an exemplary pump liner 330 with a top surface 331, bottom surface 333, sidewall 335 and support surface 334. The pump liner 330 includes a plenum 402 that extends around the body of the pump liner 330. A plurality of apertures 404 extend through the bottom wall 406 of the plenum 402 to allow a fluid to pass therethrough.

The pump liner 330 in the illustrated embodiment includes a fringe patterning ring 400 to adjust the flow of gas into and out of the plenum 402 through apertures 404. The fringe patterning ring 400 illustrated has a first ring-shaped body 410 and a second ring-shaped body 420 configured to cooperatively interact as described further herein.

Figure 6:
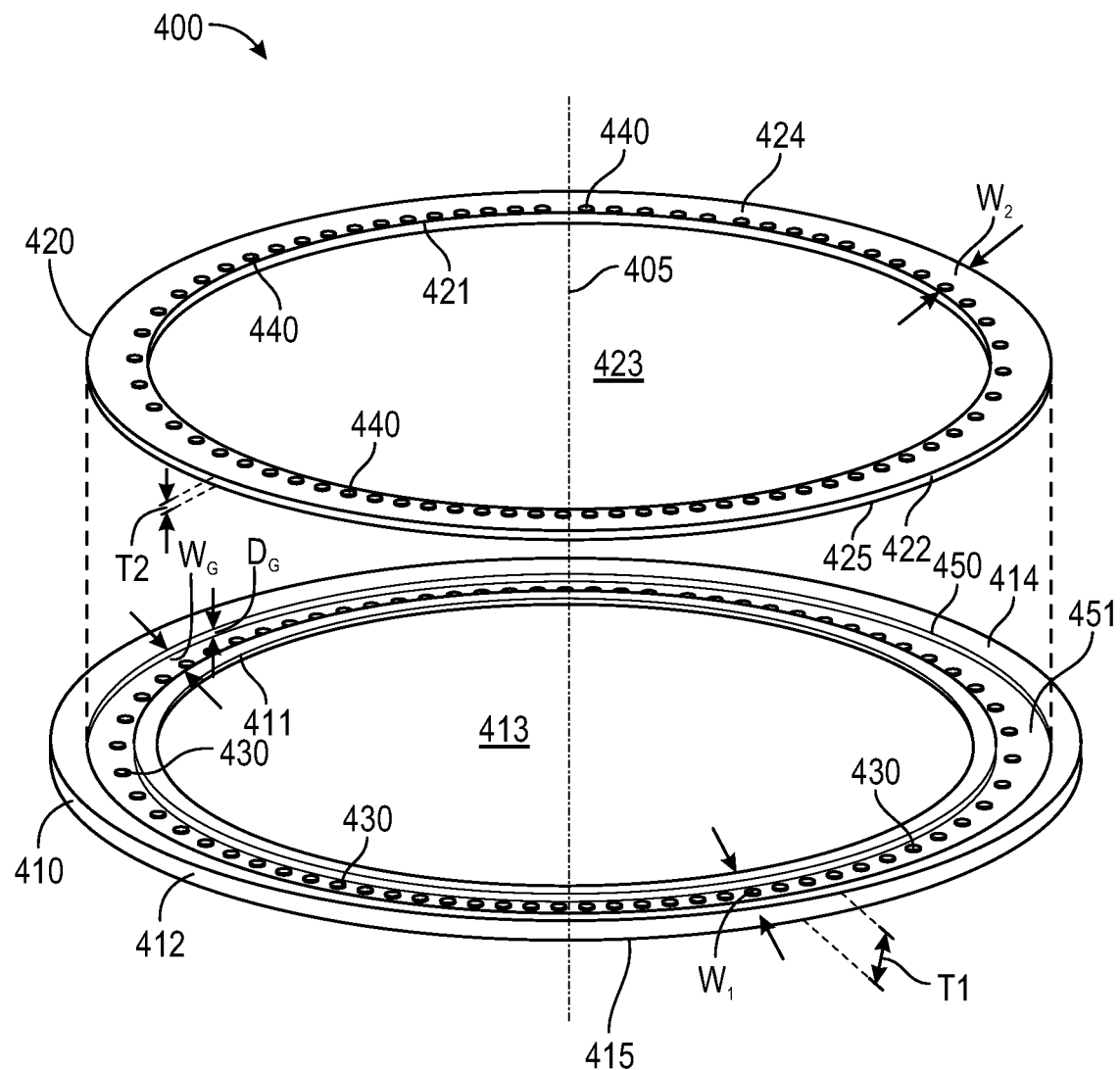
FIG. 6 is an exploded view of a fringe patterning ring for a purge ring in accordance with one or more embodiment of the disclosure.

FIG. 6 illustrates an exploded view of a fringe patterning ring 400 portion of the pump liner 330. The fringe pattern ring 400 illustrated is a part of the pump liner 330 and can be separate components than the main body of the pump liner 330 to allow for easy replacement and maintenance of the components. For example, in the embodiment illustrated in FIG. 5, the fringe pattern ring 400 is connected to the bottom surface 333 of the purge ring 330 using a suitable fastener 401. Any fastener suitable for use with semiconductor processing equipment can be used to connect the fringe pattern ring 400 to the pump liner 330.

Referring back to FIG. 6, the first ring shaped body 410 and the second ring shaped body 420 are configured to cooperatively interact to prevent unintentional leakage. The first ring-shaped body 410 has an inner peripheral edge 411 and an outer peripheral edge 412 defining a cross-sectional width $W_1$. The inner peripheral edge 411 encloses an inner diameter space 413. The first ring-shaped body 410 has a top surface 414 and a bottom surface 415 defining a thickness $T_1$.

The first ring-shaped body 410 includes a first plurality of openings 430 extending through the first ring-shaped body 410 from the top surface 414 to the bottom surface 415. Stated differently, the plurality of openings 430 extend through the thickness $T_1$ of the first ring-shaped body 410.

The second ring-shaped body 420 has an inner peripheral edge 421 and an outer peripheral edge 422 defining a cross-sectional width $W_2$. The inner peripheral edge 411 encloses an inner diameter space 423. The second ring-shaped body 420 has a top surface 424 and a bottom surface 425 defining a thickness $T_2$.

The second ring-shaped body 420 includes a second plurality of openings 440 extending through the second ring-shaped body 420 from the top surface 424 to the bottom surface 425. Stated differently the plurality of openings 440 extend through the thickness $T_2$ of the second ring-shaped body 420.

The illustrated embodiment shows the first ring-shaped body 410 below the second ring shaped body 420 so that the second ring-shaped body 420 fits into a groove 450 in the top surface 414 of the first ring-shaped body 410. In some embodiments, the first ring-shaped body 410 and the second ring-shaped body 420 are reversed so that the first ring-shaped body 410 fits into a groove 450 in the second ring-shaped body 410.

In use, when the top surface 414, 424 of one of the first ring-shaped body 410 or the second ring-shaped body 420 is adjacent the bottom surface 415, 425 of the other of the first ring-shaped body 410 or the second ring-shaped body 420, the first plurality of openings 430 are alignable with the second plurality of openings 440. As used in this manner, the term "alignable" means that the first ring-shaped body 410 and the second ring-shaped body 420 are configured to be oriented relative to each other so that first plurality of openings 430 and the second plurality of openings 440 line up to allow a fluid to pass through the thickness $T_1$, $T_2$.

The numbers, shapes and sizes of the pluralities of openings 430, 440 can be varied to provide a controlled conductance of gas through the aligned openings. In some embodiments, the first ring-shaped body 410 has in the range of 50 to 500 holes, 75 to 450 holes, 100 to 400 holes or 150 to 300 holes. In some embodiments, the second ring-shaped body 420 has in the range of 50 to 500 holes, 75 to 450 holes, 100 to 400 holes or 150 to 300 holes.

When the first plurality of openings 430 and the second plurality of openings 440 are fully aligned, the area that the In some embodiments, the first ring-shaped body 410 and the second ring-shaped body 420 are rotatable relative to each other around a central axis 405. Rotation of the first ring-shaped body 410 relative to the second ring-shaped body 420 changes the cross-sectional area of the open space available for fluid conductance.

Figure 7A:
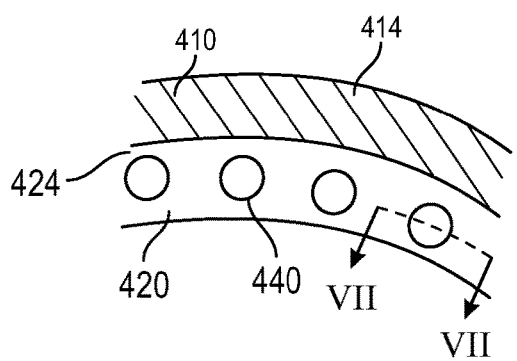
FIG. 7A is a partial schematic top view of a fringe patterning ring in accordance with one or more embodiment of the disclosure.
Figure 7B:
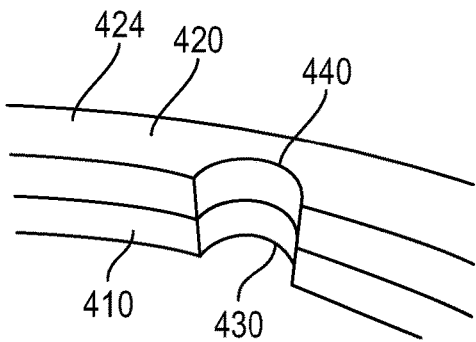
FIG. 7B is a partial perspective view of the fringe patterning ring of FIG. 7A.

FIG. 7A illustrates a schematic top view of a second ring-shaped body 420 positioned over a larger first ring-shaped body 410 with the openings 430, 440 fully aligned. FIG. 7B illustrates a partial cross-sectional view of the alignment of one set of openings taken along line VII-VII of FIG. 7A. In the illustrated embodiment, openings 430, 440 are the same size and the cross-sectional area of the combined opening, shown in FIG. 7B is the same as the cross-sectional area of either of the openings 430, 440. In some embodiments, the opening 430 is a different size than opening 440. In embodiments of this sort, the cross-sectional area of the combined openings is the same as the smaller of opening 430 or opening 440.

Figure 8A:
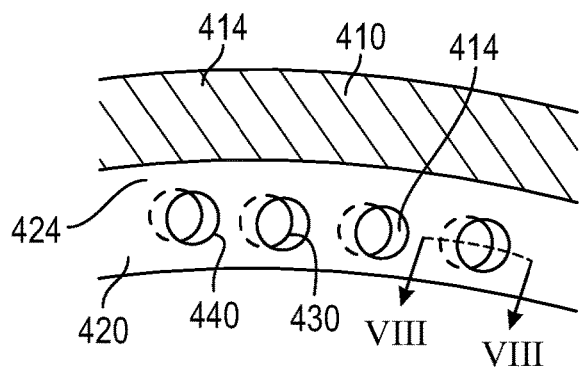
FIG. 8A is a partial schematic top view of a fringe patterning ring in accordance with one or more embodiment of the disclosure.
Figure 8B:
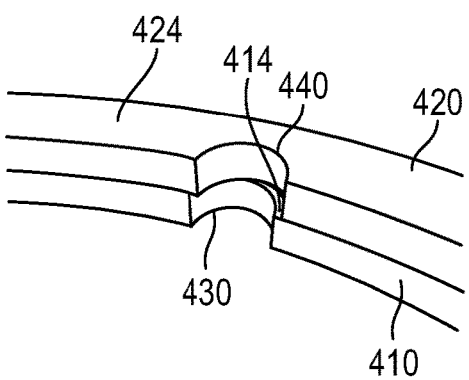
FIG. 8B is a partial perspective view of the fringe patterning ring of FIG. 8A.

FIG. 8A illustrates a schematic top view of a second ring-shaped body 420 positioned over a larger first ring-shaped body 410 with openings 430, 440 slightly misaligned. FIG. 8B illustrates a partial cross-sectional view of the alignment of one set of openings taken along line VIII-VIII of FIG. 8A. The cross-sectional area of the combined openings, shaded in FIG. 8A, is decreased from that illustrated in FIGS. 7A and 7B. Again, the illustrated embodiment has equal size openings 430, 440. A similar effect occurs when one of the openings is a different size than the other opening. In embodiments, of that sort, the cross-sectional area of the combined opening is a function of the shapes, sizes and overlap amount of the openings.

Figure 9A:
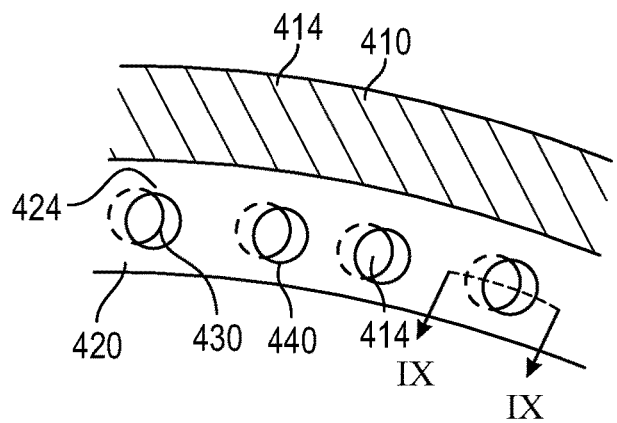
FIG. 9A is a partial schematic top view of a fringe patterning ring in accordance with one or more embodiment of the disclosure.
Figure 9B:
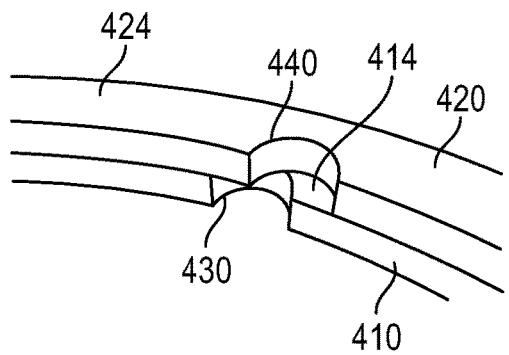
FIG. 9B is a partial perspective view of the fringe patterning ring of FIG. 9A.
Figure 10A:
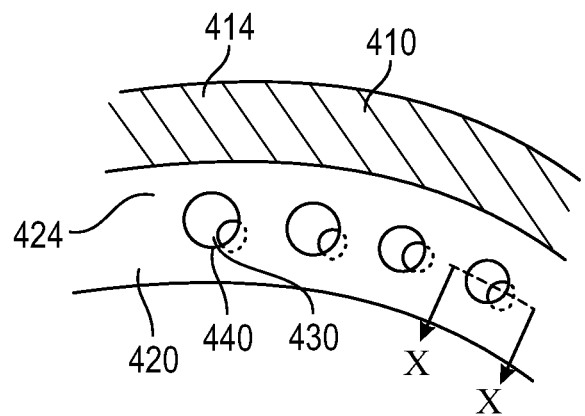
FIG. 10A is a partial schematic top view of a fringe patterning ring in accordance with one or more embodiment of the disclosure.
Figure 10B:
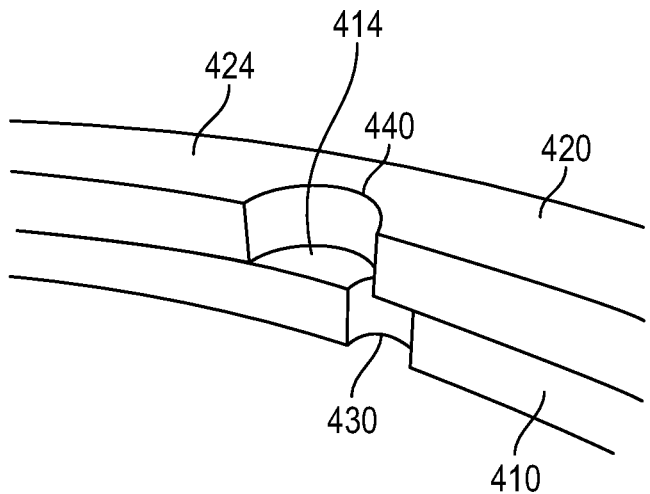
FIG. 10B is a partial perspective view of the fringe patterning ring of FIG. 10A.

FIG. 9A illustrates a schematic top view of a second ring-shaped body 420 positioned over a larger first ring-shaped body 410 with openings 430, 440 mostly misaligned. FIG. 9B illustrates a partial cross-sectional view of the alignment of one set of openings taken along line IX-IX of FIG. 9A. The cross-sectional area of the combined openings, shaded in FIG. 9A, is decreased from that illustrated in FIGS. 7A and 7B. The illustrated embodiment has equal size openings 430, 440. FIGS. 10A and 10B illustrate an embodiment similar to FIGS. 9A and 9B in which the openings 430 are much smaller than the openings 440. The cross-sectional area of the combined openings, shaded in FIG. 10A, is much smaller than that illustrated in FIG. 9A.

Referring back to FIG. 6, in some embodiments, one of the ring-shaped bodies 410, 420 has an annular groove 450 corresponding in dimensions with the other of the ring-shaped bodies. For example, in the illustrated embodiment, groove 450 is formed in the top surface 414 of the first ring-shaped body 410. In some embodiments, the first ring-shaped body 410 comprises an annular groove 450 in one or more of the top surface 414 or bottom surface 415.

In embodiments with an annular groove 450, the first plurality of openings 430 are positioned within the annular groove 450. The openings 430 in this embodiment extend from the bottom surface 451 of the groove 450 to the bottom surface 415 of the first ring-shaped body 410.

In some embodiments, the annular groove 450 of the first ring-shaped body 410 is sized to hold the second ring-shaped body 420 so that the first plurality of openings 430 and the second plurality of openings 440 are aligned. The annular groove 450 is sized to have a width $W_G$ substantially the same as width $W_2$ of the second ring-shaped body 420, and a depth $D_G$ substantially the same as the thickness $T_2$ of the second ring-shaped body 420. As used in this manner, "substantially the same" means that the width and/or depth of the groove 450 is within ±2 mm, ±1 mm or ±0.5 mm of the corresponding width or thickness of the ring-shaped body being seated within the groove.

The shape and size of the openings 430, 440 can be varied between the first ring-shaped body 410 and the second ring-shaped body 420. In some embodiments, the shape and/or size of the openings in the first ring-shaped body 410 are different at different angular positions around the ring-shaped body 410. In some embodiments, the pluralities of openings 430, 440 are substantially circular. As used in this manner, the term "substantially circular" means that the opening is cylindrical from the top surface to the bottom surface with any expected deviations resulting from manufacturing techniques.

Figure 11:
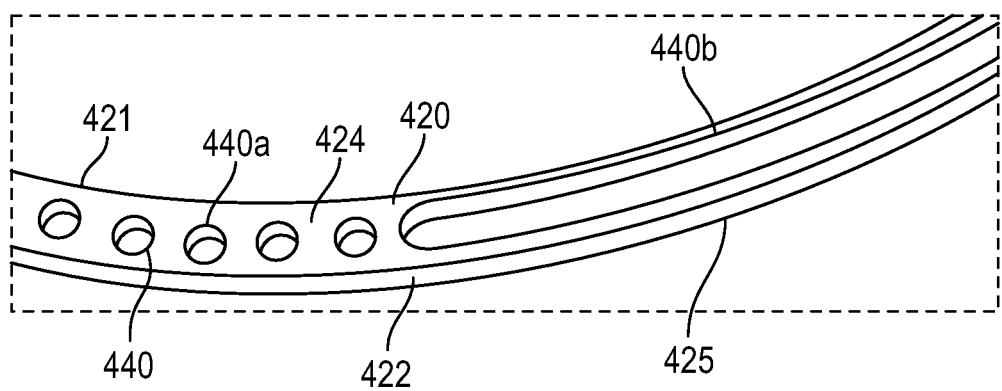
FIG. 11 is a partial isometric view of a ring-shaped body of a fringe patterning ring for a purge ring in accordance with one or more embodiment of the disclosure.
Figure 12:
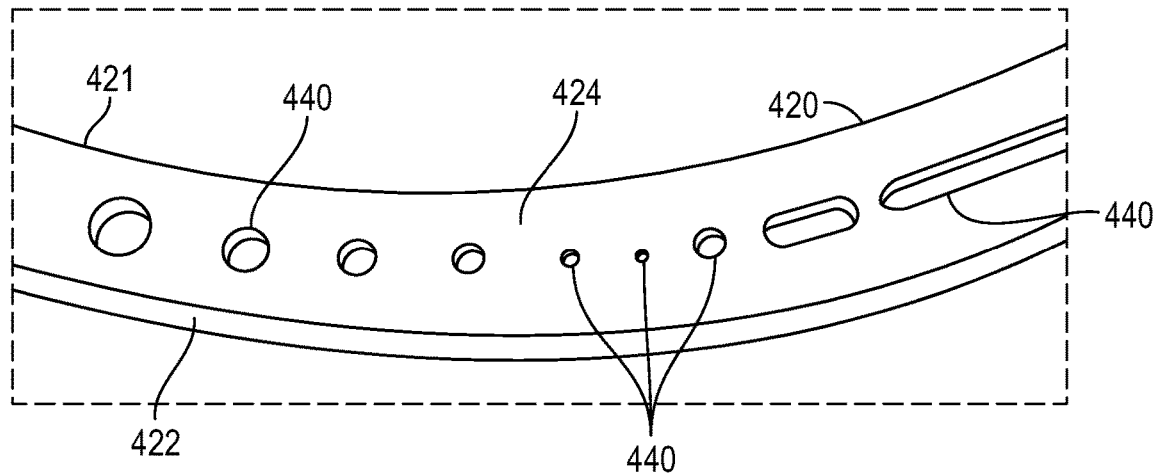
FIG. 12 is a partial isometric view of a ring-shaped body of a fringe patterning ring for a purge ring in accordance with one or more embodiment of the disclosure.

FIG. 11 illustrates an embodiment in which the plurality of openings 440 includes circular openings 440a and a slot-shaped opening 440b. The illustrate embodiment shows the second ring-shaped body 420; however, the skilled artisan will recognize that either or both of the bodies can include one or more slot-shaped openings with one or more circular openings. In some embodiments, one of the first plurality of openings 430 or the second plurality of openings 440 comprise substantially only circular openings and the other of the first plurality of openings 430 and the second plurality of openings 440 comprise a combination of circular openings and elongate slot-shaped openings. In some embodiments, both of the first plurality of openings 430 and the second plurality of openings 440 comprise a combination of circular openings and elongate slot-shaped openings. FIG. 12 shows another embodiment of the disclosure in which the plurality of openings 440 varies in both size and shape.

Referring again to FIG. 6, some embodiments of the disclosure have a circular first plurality of openings 430 with a first radius (R) and a circular second plurality of openings 440 with a second radius (r). In the illustrated embodiment, the first radius (R) is greater than the second radius (r). While FIG. 6 shows the first ring-shaped body 410 with larger openings 430, the skilled artisan will recognize that this is merely one possible configuration and should not be taken as limiting the scope of the disclosure. In some embodiments, the first radius (R) is in the range of 0.05 inches to 0.1 inches, or in the range of 0.06 inches to 0.9 inches, or in the range of 0.07 inches to 0.08 inches. In some embodiments, the second radius (r) is in the range of 0.025 inches to 0.075 inches, or in the range of 0.030 inches to 0.070 inches, or in the range of 0.035 inches to 0.065 inches, or in the range of 0.04 inches to 0.06 inches. In some embodiments, the first radius (R) is the same as the second radius (r). In some embodiments, the first radius (R) is different than the second radius (r).

In some embodiments, the first plurality of openings and the second plurality of openings are circular with an area of conductance through the combined openings determined by using:

$$A = r^2 \cos^{-1}\left(\frac{d^2 + r^2 - R^2}{2dr}\right) + R^2 \cos^{-1}\left(\frac{d^2 + R^2 - r^2}{2dr}\right) - \frac{1}{2}\sqrt{(-d+r+R)(d+r-R)(d+r+R)(d-r+R)}$$

where d is distance between centers of the first plurality of openings from centers of the second plurality of openings. In some embodiments, the area of flow conductance is in the range of 0.8 in$^2$ to 2.5 in$^2$, or in the range of 0.9 in$^2$ to 2.25 in$^2$, or in the range of 1.0 in$^2$ to 2.0 in$^2$, or in the range of 1.1 in$^2$ to 1.75 in$^2$, or in the range of 1.2 in$^2$ to 1.5 in$^2$.

Figure 13:
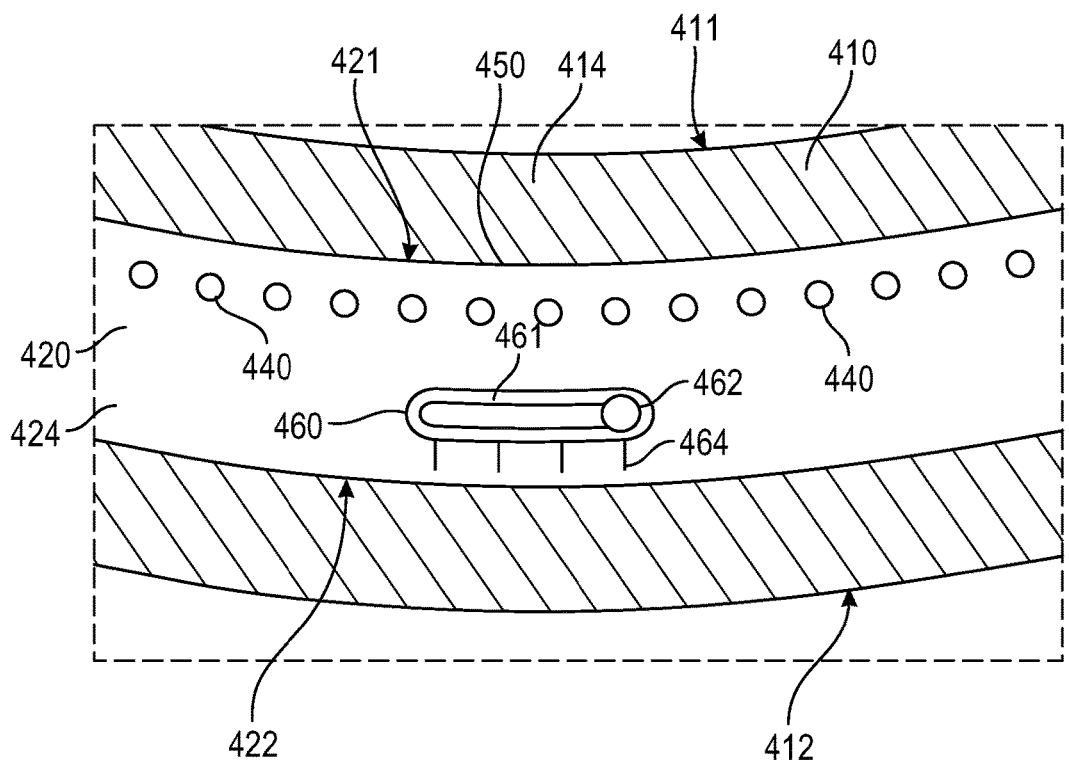
FIG. 13 is a partial isometric view of a ring-shaped body of a fringe patterning ring for a purge ring in accordance with one or more embodiment of the disclosure.

One or more embodiments of the disclosure include indicia and/or components for alignment. FIG. 13 shows a top down view of the second ring-shaped body 420 within groove 450 formed in the first ring-shaped body 410. In the illustrated embodiment, the second ring-shaped body 420 has a slot-shaped alignment opening 460 extending along a portion of the ring-shaped body 420 adjacent the outer peripheral edge 422. As used in this manner, the term "adjacent" means that the alignment opening is closer to the stated edge than the second plurality of openings 440. In some embodiments, the slot-shaped alignment opening 460 is adjacent the inner peripheral edge 421. The slot-shaped alignment opening 460 extends through the thickness $T_2$ of the second ring-shaped body 420 from the top surface 424 to the bottom surface 425.

Once the first ring-shaped body 410 and second ring-shaped body 420 are positioned to produce a predetermined fluid conductance, a fastener is used to lock the relative positions to prevent accidental misalignment during installation or maintenance. In some embodiments, an adjustment fastener 462 is configured to fix the second ring-shaped body 420 in position relative to the first ring-shaped body 410. The adjustment fastener 462 can be any suitable fastener used in semiconductor manufacturing. In the illustrated embodiment, the fastener is a screw which rests against a ledge 461 formed around the periphery of the alignment opening 460.

In some embodiments, at least one calibration mark 464 is positioned in predetermined or calibrated positions to allow repeatability and accuracy. In some embodiments, on one or more of the first ring-shaped body 410 and the second ring-shaped body 420, the at least one calibration mark 464 is indicative of a degree of overlap of the first plurality of openings 430 and the second plurality of openings 440.

Additional embodiments of the disclosure are directed to processing chambers or process stations within a processing chamber. The processing chamber comprises a gas distribution assembly, a substrate support having a support surface facing the gas distribution assembly and the pump liner described herein.

Further embodiments of the disclosure are directed to methods of removing gases from a processing chamber. A first plurality of openings 430 in a first ring-shaped body 410 are aligned with a second plurality of openings 440 in a second ring-shaped body 420 to at least partially overlap the first plurality of openings 430 with the second plurality of openings 440, or vice versa. Reduced pressure is applied to one side of the first ring-shaped body to draw gases through the at least partially overlapping first plurality of openings and the second plurality of openings. Some embodiments of the method further comprise adjusting an alignment fastener to fix the overlap of the first plurality of openings and the second plurality of openings.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A pump liner for a process chamber, the pump liner comprising:
   a first ring-shaped body having an inner peripheral edge, an outer peripheral edge, a top surface, a bottom surface, and a first plurality of openings extending through the first ring-shaped body from the top surface to the bottom surface; and
   a second ring-shaped body having an inner peripheral edge, an outer peripheral edge, a top surface, a bottom surface, and a second plurality of openings extending through the second ring-shaped body from the top surface to the bottom surface,
   wherein the top surface of one of the first ring-shaped body and the second ring-shaped body is adjacent the bottom surface of the other of the first ring-shaped body and the second ring-shaped body so that the first plurality of openings are alignable with the second plurality of openings,
   wherein the first ring-shaped body and second ring-shaped body are rotatable relative to each other around a central axis, and
   wherein the first ring-shaped body comprises an annular groove in one of the top surface or bottom surface.

2. The pump liner of claim 1, wherein the first plurality of openings are positioned within the annular groove.

3. The pump liner of claim 2, wherein the annular groove of the first ring-shaped body is sized to hold the second ring-shaped body so that the first plurality of openings and the second plurality of openings are aligned.

4. The pump liner of claim 1, wherein the second ring-shaped body further comprises a slot-shaped alignment opening extending along a portion of the ring shaped body adjacent one of the outer peripheral edge and the inner peripheral edge, the slot-shaped alignment opening extends through the second ring-shaped body from the top surface to the bottom surface.

5. The pump liner of claim 4, further comprising an adjustment fastener configured to fix the second ring-shaped body in position relative to the first ring-shaped body.

6. The pump liner of claim 5, further comprising at least one calibration mark on one or more of the first body and the second body, the at least one calibration mark indicative of a degree of overlap of the first plurality of openings and the second plurality of openings.

7. The pump liner of claim 1, wherein one of the first plurality of openings or the second plurality of openings comprises substantially only circular openings and the other of the first plurality of openings or the second plurality of openings comprises a combination of circular openings and elongate slot-shaped openings.

8. The pump liner of claim 1, wherein the first plurality of openings are circular with a first radius (R) and the second plurality of openings are circular with a second radius (r).

9. The pump liner of claim 8, wherein the first radius (R) is the same as the second radius (r).

10. The pump liner of claim 8, wherein the first radius (R) is different than the second radius (r).

11. The pump liner of claim 10, wherein the first radius (R) is in the range of about 0.05 inches to about 0.1 inches.

12. The pump liner of claim 11, wherein the second radius (r) is in the range of about 0.025 inches to about 0.075 inches.

13. The pump liner of claim 12, wherein the first plurality of openings comprises in the range of about 50 to about 500 holes.

14. The pump liner of claim 13, wherein the second plurality of openings comprises in the range of about 50 to about 500 holes.

15. The pump liner of claim 14, wherein the area of conductance is in the range of about 0.8 in$^2$ to about 2.5 in$^2$.

16. A processing chamber comprising:
a gas distribution assembly;
a substrate support having a support surface facing the gas distribution assembly; and
the pump liner of claim 1
wherein the first ring-shaped body comprises an annular groove in one of the top surface or the bottom surface, the first plurality of openings are positioned within the annular groove of the first ring-shaped body which is sized to hold the second ring-shaped body so that the first plurality of openings and the second plurality of openings are aligned.

17. A pump liner for a process chamber, the pump liner comprising:
a first ring-shaped body having an inner peripheral edge, an outer peripheral edge, a top surface, a bottom surface, and one of the top surface and bottom surface comprising an annular groove, and a first plurality of openings within the annular groove and extending through the first ring-shaped body from the top surface to the bottom surface;
a second ring-shaped body sized to fit within the annular groove of the first ring-shaped body, the second ring-shaped body having an inner peripheral edge, an outer peripheral edge, a top surface, a bottom surface, and a second plurality of openings extending through the second ring-shaped body from the top surface to the bottom surface, the second plurality of openings aligned with the first plurality of openings, and a slot-shaped alignment opening extending along a portion of the ring-shaped body adjacent one of the outer peripheral edge and the inner peripheral edge of the second ring-shaped body, the slot-shaped alignment opening extends through the second ring-shaped body from the top surface to the bottom surface;
an adjustment fastener configured to fix the second ring-shaped body in position relative to the first ring-shaped body; and
at least one calibration mark on one or more of the first body and the second body, the at least one calibration mark indicative of a degree of overlap of the first plurality of openings and the second plurality of openings
wherein the first ring-shaped body and second ring-shaped body are rotatable relative to each other around a central axis.

* * * * *